(12) United States Patent
Swerts et al.

(10) Patent No.: US 10,333,059 B2
(45) Date of Patent: Jun. 25, 2019

(54) METHOD OF FORMING A STACK OF LAYERS USING A SACRIFICIAL LAYER

(71) Applicant: IMEC VZW, Leuven (BE)

(72) Inventors: Johan Swerts, Kessel-Lo (BE); Sofie Mertens, Wijgmaal (BE)

(73) Assignee: IMEC vzw, Leuven (BE)

( * ) Notice: Subject to any disclaimer, the term of this patent is extended or adjusted under 35 U.S.C. 154(b) by 562 days.

(21) Appl. No.: 15/079,407

(22) Filed: Mar. 24, 2016

(65) Prior Publication Data

US 2016/0284987 A1  Sep. 29, 2016

(30) Foreign Application Priority Data

Mar. 24, 2015 (EP) ..................................... 15160520

(51) Int. Cl.
*H01L 43/12* (2006.01)
*H01F 41/18* (2006.01)
(Continued)

(52) U.S. Cl.
CPC ............. *H01L 43/12* (2013.01); *H01F 41/18* (2013.01); *H01F 41/183* (2013.01); *H01L 43/08* (2013.01); *H01L 43/10* (2013.01); *H01L 21/2855* (2013.01); *H01L 21/7685* (2013.01); *H01L 21/76865* (2013.01)

(58) Field of Classification Search
CPC ... C23C 14/021; C23C 14/022; C23C 14/024; C23C 14/028
See application file for complete search history.

(56) References Cited

U.S. PATENT DOCUMENTS 7,855,147 B1 * 12/2010 Dulkin ................. C23C 14/022
257/E21.161
2009/0073737 A1   3/2009 Klostermann et al.

OTHER PUBLICATIONS

European Search Report issued in Application No. EP 15160520 dated Aug. 20, 2015.
(Continued)

*Primary Examiner* — John J Brayton
(74) *Attorney, Agent, or Firm* — Knobbe, Martens, Olson & Bear LLP

(57) ABSTRACT

The disclosed technology generally relates to forming a semiconductor structure and more particularly to forming a stack of layers of a semiconductor structure using a sacrificial layer that is removed during deposition of a functional layer. In one aspect, the disclosed technology relates to a method of protecting a top surface of a layer in a semiconductor structure. The method comprises: providing the layer on a substrate, the layer having an initial thickness and an initial composition; forming a sacrificial metal layer on and in contact with the layer, the sacrificial metal layer comprising a light metal element; and depositing by physical vapor deposition a functional metal layer on and in contact with the sacrificial metal layer. The sacrificial metal layer is removed by sputtering during the deposition of the functional metal layer, such that an interface is formed between the layer and the functional metal layer. The sacrificial metal layer protects the layer during the deposition of the functional metal layer, such that the layer has a final thickness which substantially matches the initial thickness and a final composition which substantially matches the initial composition.

15 Claims, 6 Drawing Sheets

(51) Int. Cl.
*H01L 43/08* (2006.01)
*H01L 43/10* (2006.01)
*H01L 21/285* (2006.01)
*H01L 21/768* (2006.01)

(56) References Cited

OTHER PUBLICATIONS

Swerts, J. et al., "BEOL compatible high tunnel magneto resistance perpendicular magnetic tunnel junctions using a sacrificial Mg layer as CoFeB free layer cap", Applied Physics Letters, American Institute of Physics, vol. 106, No. 26, Jun. 29, 2015.

* cited by examiner

METHOD OF FORMING A STACK OF LAYERS USING A SACRIFICIAL LAYER

CROSS-REFERENCE TO RELATED APPLICATIONS

This application claims foreign priority to European Patent Application No. 15160520.1, filed Mar. 24, 2015, the content of which is incorporated by reference herein in its entirety.

BACKGROUND

Field

The disclosed technology generally relates to forming a semiconductor structure and more particularly to forming a stack of layers of a semiconductor structure using a sacrificial layer.

Description of the Related Technology

Semiconductor technology continues to integrate increasingly smaller feature sizes, and correspondingly continues to increase the device density and functionality per unit area. Increasing device density in turn enables proportional reductions in device footprint and cost. The trend of downscaling, however, continues to introduce new and previously unmet challenges with each successive generation.

Generally, semiconductor device fabrication involves formation of various semiconductor structures by patterning, e.g., by forming (e.g., depositing) and removing (e.g., etching) one or more layers of materials. When forming a semiconductor structure having a plurality of layers of materials, each layer may be selected to provide a particular functional feature within the semiconductor structure. Individual layers are generally deposited during fabrication of the semiconductor structure to form various functional structures. For example, a metal layer may be deposited to form, e.g., metallization and electrical contacts, among other electrically conducting structures, while a dielectric layer may be deposited to form, e.g., isolation structures and spacer structures, among other electrically insulating structures.

Generally, smaller devices are more prone to being detrimentally affected by defects, which may lead to, e.g., increased current leakage and charge trapping. Even relatively small variations in the nanometer-scale of the material structure/composition and the interfaces between the layers may substantially degrade the device performance. As a result, the smaller feature sizes increase the need for advanced fabrication techniques with reduced defects.

Physical vapor deposition (PVD) is a fabrication technique used to deposit thin layers in most semiconductor devices by condensation of a vaporized target material onto a substrate. To meet the increasing needs of physical scaling of semiconductor devices, there is a corresponding need to improve PVD techniques for fabrication of various structures by depositing thin films with improved purity, improved thickness control and smoother interfaces between adjacent layers.

There is therefore a need for improved techniques for forming semiconductor structures comprising a plurality of layers using PVD.

SUMMARY OF CERTAIN INVENTIVE ASPECTS

It is an object of the disclosed technology to provide an improvement of the above techniques and prior art.

In one aspect, a method comprises: providing a layer on a substrate, the layer having an initial thickness and an initial composition, and a top surface; depositing by physical vapor deposition (PVD) a sacrificial metal layer on and in contact with the top surface, the sacrificial metal layer comprising a light metal element; and depositing by physical vapor deposition a functional metal layer on and in contact with the sacrificial metal layer. The sacrificial metal layer is substantially removed by sputtering during the deposition of the functional metal layer such that an interface is formed between the layer, e.g., the top surface of the layer, and the functional metal layer. As used herein, a sacrificial metal layer that is substantially removed may have a final thickness that is about +/−5% of an initial thickness. The sacrificial metal layer substantially protects the top surface during the deposition of the functional metal layer such that the layer has a final thickness substantially matching the initial thickness and a final composition substantially matching the initial composition. As used herein, a final thickness that substantially matches an initial thickness may be within about +/−5% of the initial thickness. As used herein, a final composition that substantially matches an initial composition may be within about 95% of the initial composition with respect to each of the constituent element.

The present disclosure is based on the realization that the use of a sacrificial metal layer may reduce damages to a layer when depositing a functional metal layer on top of the layer.

Initially, a layer is provided on a substrate. The layer may be provided directly or indirectly on the substrate. In other words, other layers or structures may be provided between the substrate and the layer. The layer provided on the substrate has an initial thickness and an initial composition. Further, the layer has a top surface. The top surface is the surface of the layer facing away from the substrate.

A sacrificial metal layer is deposited on and in contact with the top surface by physical vapor deposition (PVD). In other words, a sacrificial metal layer is deposited in physical contact with the top surface. The sacrificial metal layer comprises a light metal element.

It should be noted that within the context of this application the term "light metal element" may be any metal element having an atomic number of 36 or less. Hence, a light metal element may be any metal element in the first four periods of the periodic table.

A functional metal layer is deposited on and in contact with the sacrificial metal layer by PVD. During the deposition of the functional metal layer, the sacrificial metal layer is removed by sputtering, resulting in that an interface is formed between the top surface and the functional metal layer. The sputtering is caused by the physical vapor deposition of the functional metal layer, when the atoms forming the functional metal layer impinges on the sacrificial metal layer. The sputtering of the sacrificial metal layer involves two major mechanisms removing the atoms of the sacrificial metal layer. The first mechanism is physical sputtering of the sacrificial metal layer and the second mechanism is evaporation of the sacrificial metal layer. In order to achieve the sputtering of the sacrificial metal layer the atoms forming the functional metal layer need to transfer a sufficient impulse to the atoms of the sacrificial metal layer. The impulse transferred is mainly determined by the velocity and weight of the atoms forming the functional metal layer.

The sacrificial metal layer protects the top surface during the deposition of the functional metal layer. Hence, the atoms forming the functional metal layer will impinge on and sputter the sacrificial metal layer, such that top surface is not affected or only affected to a limited amount by the atoms forming the functional metal layer. The protective effect caused by the sacrificial metal layer results in that, the layer having the top surface has a final thickness matching or substantially matching the initial thickness and a final composition corresponding to the initial composition.

As used to describe various features herein, the terms "final thickness" and "final composition" refer to the thickness and the composition after completion of the deposition of the functional metal layer. As used herein, a thickness substantially matching another thickness, such as a final thickness substantially matching an initial thickness may refer to a situation where the final thickness corresponds to about ±5% of the initial thickness. In addition, the "final composition corresponding to the initial composition" may refer to a final composition where at least to 95% of the composition with respect to each element corresponds to those of the initial composition.

Besides, the protective effect results in that, the intermixing of the top surface and the functional material during deposition of the functional layer is reduced.

According to embodiments, the layer may comprise Co, Fe, B, or a combination thereof, which is advantageous in that the method may be used with magnetic layers.

According to embodiments, the sacrificial metal layer may comprise Mg, Al, Ca, Zn, or a combination thereof, which is advantageous in that the sacrificial metal layer may be removed by sputtering during the deposition of the functional metal layer. Moreover, by this arrangement the risk of damaging the top surface of the layer may be minimized as Mg, Al, Ca and Zn are light metal elements which may be deposited on the top surface with a reduced risk of damaging the top surface. Further, Mg, Al, Ca and Zn efficiently protect the top surface during the deposition of the functional metal layer. Preferably Mg is used for the sacrificial metal layer.

According to embodiments, the functional metal layer may be an amorphous metal layer.

According to embodiments, the functional metal layer may comprise Ta.

According to embodiments, the thickness of the sacrificial metal layer may be smaller than three times the thickness of the functional metal layer. By this arrangement, the sacrificial layer may be substantially completely removed during the deposition of the functional metal layer. For instance, when using Ta in the functional metal layer and Mg in the sacrificial metal layer, 2-3 Å of Mg is removed during the deposition of 1 Å Ta. In other words, the sputter yield has a factor of 2-3. A specific factor will be determined by the respective elements and system parameters used.

According to embodiments, the thickness of the sacrificial metal layer may be smaller than 2 nm, which is advantageous in that the sacrificial layer may be completely removed during the deposition of the functional metal layer.

According to embodiments, the method may further comprise annealing the semiconductor structure at an elevated temperature of 250° C.-400° C., wherein the layer at least partially crystallizes into a [001] orientated layer, which is advantageous in that desired magnetic properties of the layer may be achieved. A [001] orientated layer may result in an increased tunnelling magneto resistance, TMR.

According to embodiments, the layer may have perpendicular magnetic anisotropy, which is advantageous in that the layer may exhibit desired magnetic properties.

According to embodiments, the layer and the functional metal layer may form part of a spin-transfer torque magnetoresistive random-access memory stack, STT-MRAM stack. By incorporating the layer and the functional metal layer in a STT-MRAM stack, an improved memory may be achieved.

According to embodiments, the method may further comprise forming a magnetic tunnel junction (MTJ) by means of physical vapor deposition, wherein the layer forms part of the magnetic tunnel junction. By this arrangement, a memory device having improved read, write and stability properties may be achieved.

According to embodiments, the method may further comprise forming an electrode adjacent to the functional metal layer, which is advantageous in that the electrode may be used to contact the functional metal layer and hence a device in which the functional metal layer may be incorporated.

According to embodiments, the layer may comprise a high-k dielectric material or an oxide. By this arrangement, the method may advantageously be used to fabricate various types of devices. More specifically, the method may advantageously be used when the formation of an interface between a high-k dielectric or an oxide material and another material is crucial in the sense that the high-k dielectric or the oxide material need to be protected during the formation of other material such that the risk of damaging the high-k dielectric or the oxide material is reduced.

The functional metal layer may comprise Co, Ti, W, Mo, Ru, Hf, or a combination thereof which is advantageous in that the method may be used to fabricate various types of devices comprising Co, Ti, W, Mo, Ru or Hf.

Further features of, and advantages with, the present disclosure will become apparent when studying the appended claims and the following description. The skilled person will realize that different features of the present disclosure may be combined to create embodiments other than those described in the following, without departing from the scope of the present invention.

BRIEF DESCRIPTION OF THE DRAWINGS

This and other aspects of the present disclosure will now be described in more detail, with reference to the enclosed drawings showing embodiments of the invention.

DETAILED DESCRIPTION OF CERTAIN ILLUSTRATIVE EMBODIMENTS

The present disclosure will now be described more fully hereinafter with reference to the accompanying drawings, in which currently preferred embodiments of the disclosure are shown. This disclosure may, however, be embodied in many different forms and should not be construed as limited to the embodiments set forth herein. These embodiments are rather provided for thoroughness and completeness, and for fully conveying the scope of the disclosure to the skilled person.

In the following a semiconductor structure and a method for protecting a top surface of a layer in the semiconductor structure will be described, with reference to FIGS. 1a and 1b.

Figure 1A:
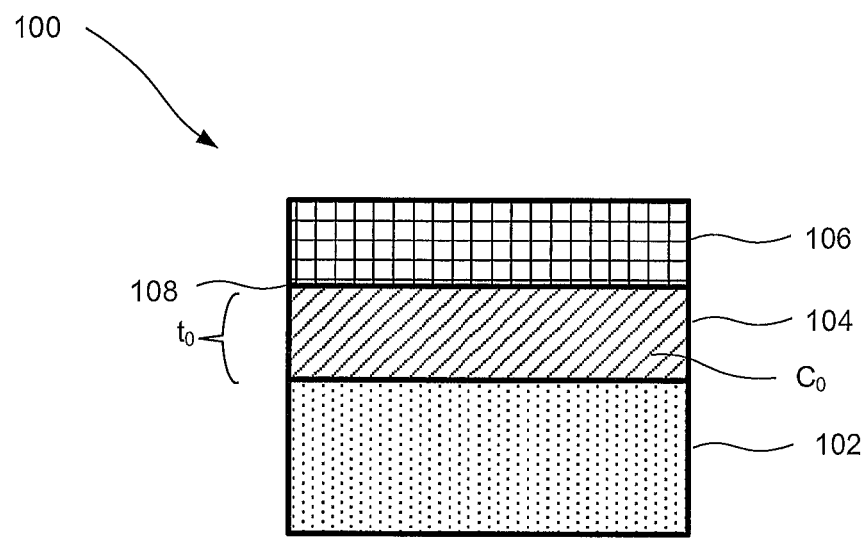
FIG. 1a illustrates an intermediate semiconductor structure prior to forming a functional layer, according to embodiments of the present disclosure.

FIG. 1a illustrates a pre-stage of a semiconductor structure 100, according to embodiments. The pre-stage of the semiconductor structure 100 comprises a substrate 102, a layer 104 and a sacrificial metal layer 106. The layer 104 has an initial thickness, $t_0$, and an initial composition $C_0$, and a top surface 108.

The sacrificial metal layer 106 can be provided by a deposition technique, e.g., physical vapor deposition (PVD) whereby the sacrificial metal layer 106 is formed on and in contact with the top surface 108 of the layer 104. The top surface 108 is the surface of the layer facing away from the substrate. However, other embodiments are possible, where the sacrificial metal layer is formed by other techniques, e.g., chemical vapor deposition, evaporation or electroplating, among other possible techniques for forming a metal layer.

The sacrificial metal layer 108 comprises, as will be further discussed below, a light metal element.

Figure 1B:
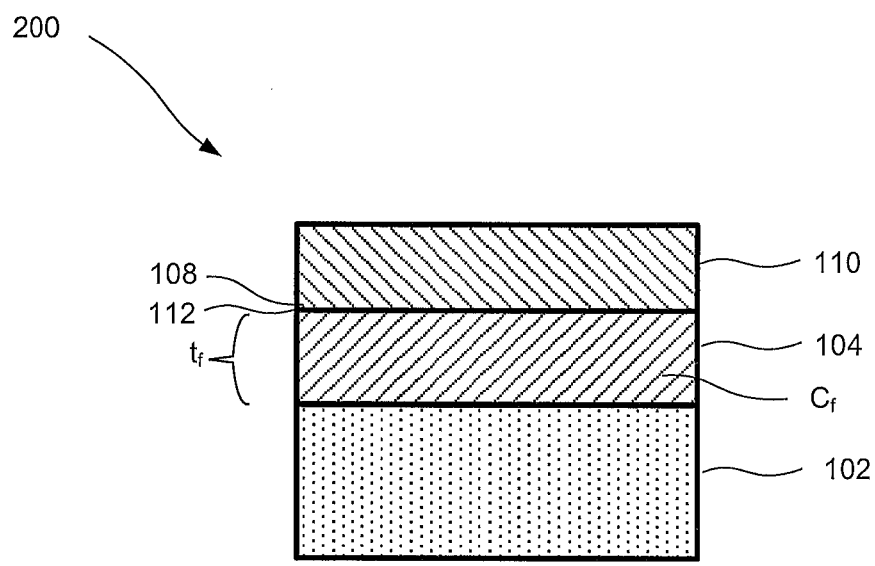
FIG. 1b illustrates an intermediate semiconductor structure prior to forming a functional layer, according to embodiments of the present disclosure.

FIG. 1b illustrates a semiconductor structure 200 resulting after further processing of the pre-stage of the semiconductor structure 100. The semiconductor structure 200 comprises the substrate 102, the layer 104 and a functional metal layer 110.

To form the semiconductor structure 200 from the pre-stage of the semiconductor 100, the functional metal layer 110 is provided by a physical deposition technique, such as physical vapor deposition (PVD). As used herein, a physical deposition technique refers to a technique in which the depositing atoms have more than thermal energy (i.e., kT). While PVD is an example of a physical deposition technique, certain other deposition techniques such as certain chemical vapor deposition (CVD) techniques can be also be used to practice the methods described herein. For example, when the substrate is electrically biased, depositing atoms in a CVD process may have more than thermal energy.

The functional metal layer 110 is thereby deposited on and in contact with the sacrificial metal layer 106. During the depositing of the functional metal layer 110 the sacrificial metal layer 106 is at least partially removed by sputtering such that an interface 112 is formed between the top surface 108 and the functional metal layer 110. While it is removed during the deposition of the functional metal layer 110, the sacrificial metal layer 106 protects the top surface 108 during the deposition of the functional metal layer 110. For example, the sacrificial layer 106 may be gradually removed during the deposition of the functional metal layer 110 such that the top surface of the underlying layer 104 remains substantially covered by the sacrificial metal layer 106 until towards the end of the duration of the deposition of the functional metal layer 110. In other words, the sacrificial metal layer 106 thereby acts as a protecting layer, or as a cushion, reducing physical effects on the top surface 108 during the sputtering of the functional metal layer 110.

In some embodiments, an improved quality of the layer 104 is thereby achieved by substantially removing the sacrificial metal layer 106 by ion bombardment during the deposition of the functional metal layer 110. In other embodiments, an improved quality of the layer 104 is achieved by entirely removing the sacrificial layer 106 by ion bombardment. It will be appreciated that, taking into account of of certain statistical or other physical variations during the course of semiconductor processing, the sacrificial layer 106 may be described to be substantially removed when, on average across the sacrificial layer 106, a final thickness is about +/−5% of an initial thickness, for instance about 0%. It will be also be appreciated that when the sacrificial layer 106 is described to be substantially removed, it may be completely removed from some portions of the layer while remaining on other portions, such that on average, the final thickness is about +/−5% of the initial thickness, for instance about 0%.

In some embodiments, an improved quality of the layer 104 is achieved by substantially preventing the underlying layer 104 from being removed by ion bombardment during the deposition of the functional metal layer 110. In other embodiments, an improved quality of the layer 104 is achieved by entirely preventing the underlying layer 104 from being removed by ion bombardment. It will be appreciated that, taking into account of of certain statistical or other physical variations during the course of semiconductor processing, the layer 104 may be described to be substantially prevented from being removed when, on average across the layer 104, a final thickness is within about +/−5% of an initial thickness, for instance about 0% of the initial thickness. It will be also be appreciated that when the layer 104 is described to be substantially removed, it may be completely prevented from being removed from some portions of the layer while incompletely prevented from being removed in other portions, such that on average the a final thickness is within about +/−5% of the initial thickness, for instance within about 0% of the initial thickness. In this respect, in some embodiments, the layer 104 has a final thickness, $t_f$, which substantially matches an initial thickness, $t_0$.

In some embodiments, when the underlying layer 104 is substantially prevented from being removed by ion bombardment, its composition, e.g., its surface composition, remains substantially unchanged. In other embodiments, its composition, e.g., its surface composition, remains entirely unchanged. It will be appreciated that, because of certain statistical or other physical variations, the composition of the layer 104 may be described to be substantially unchanged when, on average across the layer 104, a final concentration of each chemical element is within about +/−5% of an initial concentration. In this respect, in some embodiments, the layer 104 has a final composition, $C_f$, which substantially matches an initial composition $C_0$.

Atoms forming the functional metal layer 110 may, during the PVD process, impinge on and thereby sputter the sacrificial metal layer 106, while substantially not impinging the layer 104 such that the top surface 108 of the layer 104 is not affected or only affected to a limited amount by the atoms forming the functional metal layer 110. This is a result of the sacrificial metal layer 106 protecting the top surface 108 during the deposition of the functional metal layer 110. The layer 104 having the top surface 108 has therefore a final thickness, $t_f$, matching or substantially matching the initial thickness, $t_0$, and a final composition, $C_f$, matching or substantially matching to the initial composition, $C_0$. An improved interface 112 may thereby be formed between the top surface 108 and the functional metal layer 110.

Figure 2A:
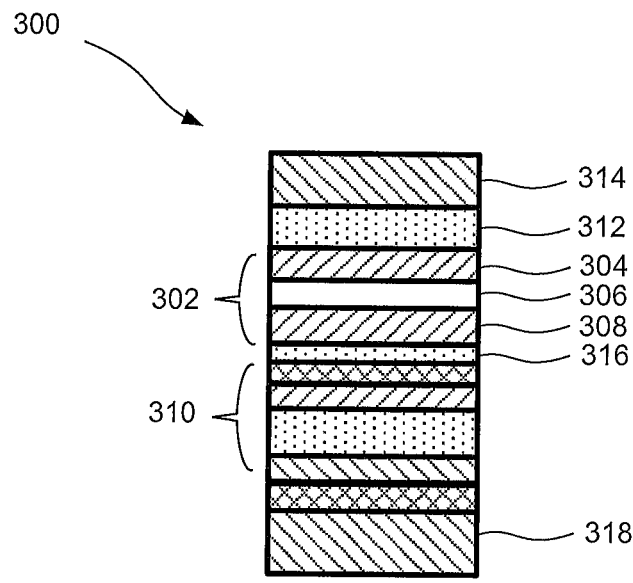
FIGS. 2a and 2b illustrates a semiconductor structure as part of one implementation of spin-torque transfer magnetic random access memories (STT-MRAMs), according to embodiments.

The structure of FIGS. 1a and 1b may, respectively, form parts of a pre-stage of a semiconductor structure device or a semiconductor structure device. FIG. 2a illustrates a semiconductor structure device configured as part of a spin-torque transfer magnetic random access memory (STT-MRAM), according to some embodiments.

STT-MRAMs, like the STT-MRAM 300, are attracting much attention because of their potential in offering a reduction of power consumption through non-volatility and a reduction of the size of memory cells compared to conventional memory cells.

In various embodiments, the STT-MRAM device 300 comprises a magnetic tunnel junction, MTJ, 302 providing a tunnel magneto resistance, TMR. It is further known that some MTJs may have perpendicular magnetic anisotropy (PMA) such that a so called p-MTJ is formed. A p-MTJ has a magnetic anisotropy that is perpendicularly oriented relative to the direction of tunnelling of spin polarized electrons, or relative to a main surface of the free layer and the fixed layer of the MTJ. The use of a p-MTJ generally offers an improved current switching and high thermal stability for the STT-MRAM device 300.

The MTJ 302 may be formed by means of physical vapor deposition. The MTJ 302 comprises a stack of layers 304, 306, and 308. The stack of layers may, for example, comprise CoFeB, MgO, and CoFeB, respectively. The CoFeB layers 304 and 308 form the magnetic layers and the MgO layer 306 forms the insulating layer, also referred to as the tunnelling layer, of the MTJ 302.

Again referring to FIGS. 1a and 1b, the CoFeB layer 304 is to be understood to correspond to the layer 104.

The CoFeB layers 304 and 308 have preferentially [001] textures in order to obtain a high TMR. To this end, a Co/Ni perpendicular synthetic anti-ferromagnet (p-SAF) structure 310 is provided, which is arranged to pin the magnetization the CoFeB layer 308. The p-SAF structure 310 may also be referred to as a reference layer (RL).

The CoFeB layer 304 is the switching element of the STT-MRAM device 300 and is commonly referred to as a free layer (FL).

In various embodiments, the STT-MRAM device 300 further comprises a functional metal layer 312 arranged on top of and in contact with the CoFeB layer 304. The functional metal layer 312 is an amorphous metal layer. The functional metal layer 312 comprises Ta or is formed of Ta. It should, however, be noted that the functional metal layer may in other embodiments comprise an alloy comprising Ta or be formed by Ta. The metal layer may moreover be a crystalline metal layer.

The STT-MRAM device 300 may further comprise an electrode 314 formed adjacent to the functional metal layer 312.

The electrode 314, which may be referred to as a top electrode, may comprise Ru/Ta/Ru.

The skilled person in the art realizes that Ta may be used at various other positions within the STT-MRAM 300. An additional Ta layer 316 may therefore for instance be used as an amorphous interlayer to avoid texture transfer from the (111) textured FCC Co/Pt or Co/Ni based p-SAF structure 310 to the (001) textured BCC CoFeB layer 308 during a crystallization anneal.

Besides, an additional Ta layer might be used as part of the free layer to form a CoFeB/Ta/CoFeB free layer structure.

To this end, a semiconductor structure such as a STT-MRAM structure, may comprise an oxide layer. A MgO layer may for instance be used as a capping layer arranged on top of a CoFeB layer as the formed MgO/CoFeB interface may enhance the perpendicular anisotropy of the STT-MRAM structure. The skilled person realizes that the use of a sacrificial layer comprising for instance Mg may be used to efficiently protect the oxide layer during deposition of a functional metal layer on top of the oxide layer.

To provide efficient charge transfer in the STT-MRAM 300 a bottom electrical contact 318 is further arranged below the p-SAF structure 310.

Figure 2B:
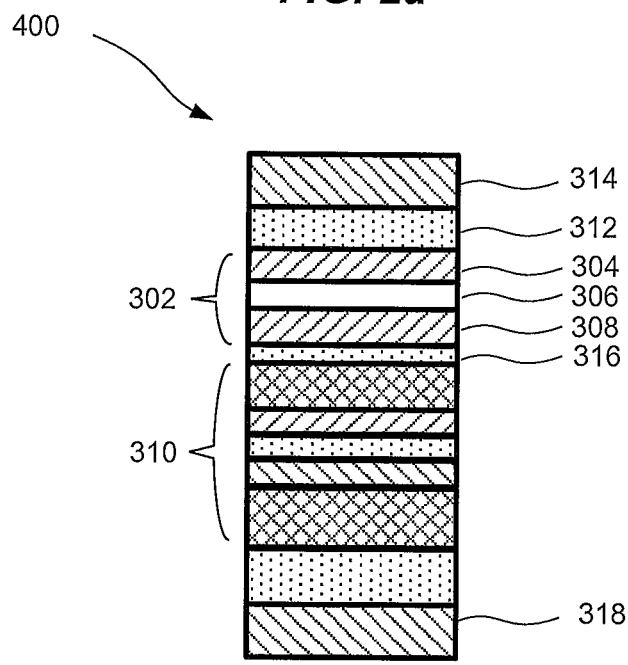

The skilled person in the art realizes that according to other embodiments a Co/Pt, or Co/Pd p-SAF structure may be used. FIG. 2b illustrates a STT-MRAM 400 comprising a Co/Pt p-SAF structure 310. The structure of the STT-MRAM 400 is similar to the structure of the STT-MRAM 300, why its construction and function will not be described in detail in order to avoid undue repetition.

It should be noted that the properties and performance of the STT-MRAMs 300, 400 depends critically of the quality of their MTJs 302, which in turn are sensitive to the quality of the functional metal layer 312.

The depicted p-MTJ's 302, of FIGS. 2a and 2b, on the bottom pinned p-SAF's 310 were deposited in-situ by physical vapor deposition, PVD, in a 300 mm cluster tool, EC7800 Canon-Anelva, on TaN-based bottom electrodes 318 on a substrate (not shown). The bottom electrodes 318 were moreover smoothened down to 0.05 nm root mean square roughness via chemical mechanical polishing, CMP prior to depositing the respective p-SAF's 310. The CoFeB layers 304 and 308 were also formed by PVD.

The functional metal layers 312 of Ta were formed by use of a sacrificial metal layer (not shown) as discussed in relation to FIGS. 1a and 1b. The sacrificial metal layers consisted in the fabrication of the STT-MRAMs 300, 400 of 0.65 nm of Mg which were deposited, by means of PVD, on top of the CoFeB layers 304. The CoFeB layers 304 had a thickness of 1.5 nm.

During this PVD deposition of Ta on Mg, the light Mg atoms are removed by being sputtered by the impinging Ta atoms forming the functional metal layers 312. As a result a functional metal layer 312 comprising Ta is formed on the respective CoFeB layers 304. The deposition of the respective functional metal layers 312 resulted in a layer thickness of 1 nm.

After the respective PVD depositions, the substrates received a 30 minute 300° C. crystallization vacuum anneal in presence of a 1 Tesla magnetic field in a TEL-MSL MRT5000 batch annealing system.

By annealing the respective STT-MRAMs 300, 400 at an elevated temperature of 250° C.-400° C., the layers 304 and 308 may at least partially crystallize into a [001] orientated layer, which may result in an increased TMR.

In the following the properties and performance of the STT-MRAMs 300, 400 as well as similar device structures will be described.

Figure 3A:
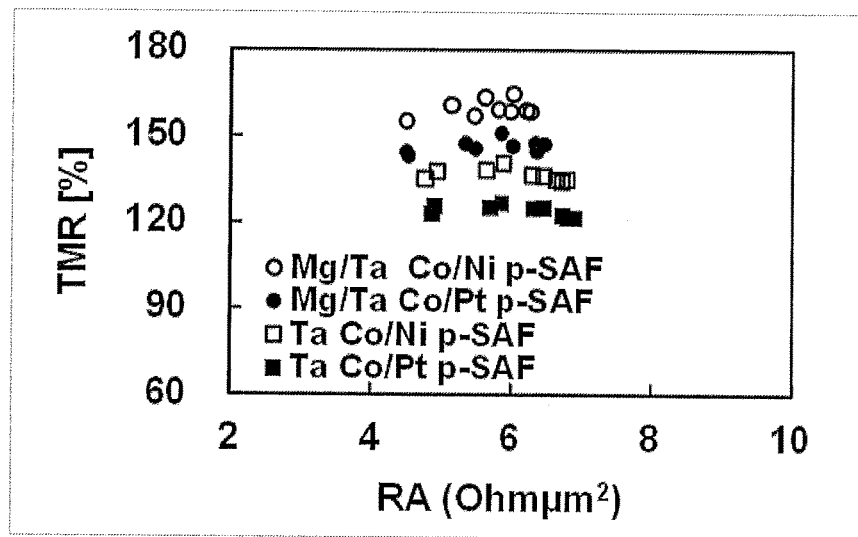
FIGS. 3a and 3b illustrate measured tunnelling magnetoresistance ratios (TMR) of STT-MRAM structures fabricated using a method according to embodiments, plotted as function of resistance area product, RA, and thickness.

FIG. 3a shows experimental data of measured TMR, indicated with open symbols, for the STT-MRAMs 300, and 400, i.e. STT-MRAMs comprising Ta functional layers 304 with a thickness of 1 nm which were formed by utilizing a Mg sacrificial metal layer with a thickness of 0.65 nm. The TMR for the STT-MRAMs 300, 400 were measured to be about 20% higher than the TMR of a reference sample comprising a functional layer of Ta deposited without utilizing a sacrificial metal layer, illustrated by solid symbols in FIG. 3a. FIG. 3a also shows that for both Co/Pt p-SAF structures, square symbols, and ultrathin Co/Ni BP p-SAF structures, circle symbols, for pinning the reference layer 308 it is advantageous to use MTJs 302 comprising functional metal layers 312 which have been formed using sacrificial metal layers.

Figure 3B:
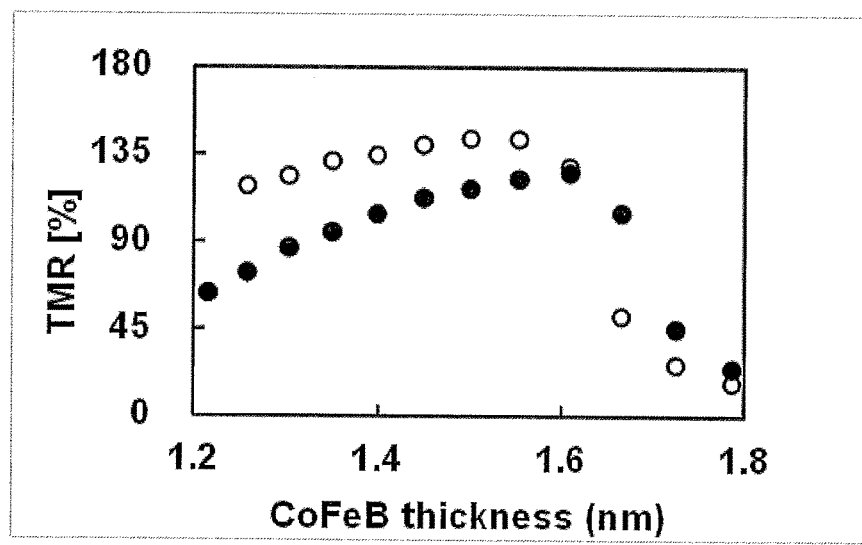

FIG. 3b further illustrates that an increase in TMR may reach 35% when the thickness of the CoFeB layer 304, i.e. the free layer, is reduced to about 1.3 nm. The decrease of the TMR may be attributed to the loss of perpendicular magnetic anisotropy of the CoFeB layer 304. Since the decrease occurs earlier for the functional metal layer 312 formed using a Mg sacrificial metal layer it may, erroneously, be concluded that the earlier drop of the PMA is a result of the functional metal layer 312 formed using a Mg sacrificial metal layer. However, this drop is not related to the weaker interfacial anisotropy resulting from the functional metal layer 312 formed using a Mg sacrificial metal layer. The earlier drop should, instead be attributed to a magnetic moment of the CoFeB layer 304 which is higher in the case of the functional metal layer 312 being formed using a Mg sacrificial metal layer indicating that a thinner dead moment is formed during Mg/Ta deposition.

Elastic recoil detection, ERD, measurements on films comprising CoFeB layers 304 and functional metal layers 312 of Ta, where the functional metal layers 312 were formed using Ta sacrificial metal layers will be described in the following.

Figure 4A:
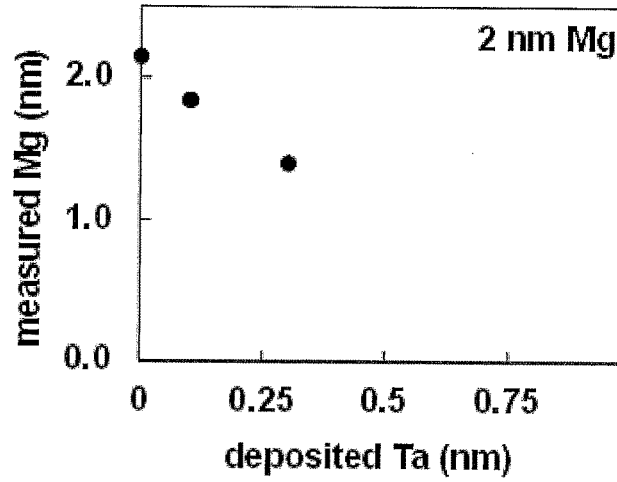
FIGS. 4a, 4b and 4c illustrate measurements for STT-MRAM structures fabricated using a method according to embodiments, illustrating sputtering of Mg during Ta deposition.

FIG. 4a illustrates the measured Mg thickness extracted from ERD measurements for films comprising 1.5 nm thick CoFeB layers and Ta functional metal layers with varying thicknesses, x. The respective Ta functional metal layers were deposited on a Mg sacrificial metal layer having a thickness of 2 nm. FIG. 4a illustrates that the Mg is sputtered by about 2 nm during a 1 nm Ta deposition.

It may therefore be advantageous if the thickness of the sacrificial metal layer is larger than the thickness of the functional metal layer. The thickness of the sacrificial metal layer may for example be larger than but three times smaller than the thickness of the functional metal layer. By such an arrangement the sacrificial layer may be completely removed during the deposition of the functional metal layer.

The etching ratio when depositing Ta on Mg is about 2, i.e. approximately 2 nm of the Mg sacrificial metal layer is etched per 1 nm deposited Ta functional metal layer.

Figure 4B:
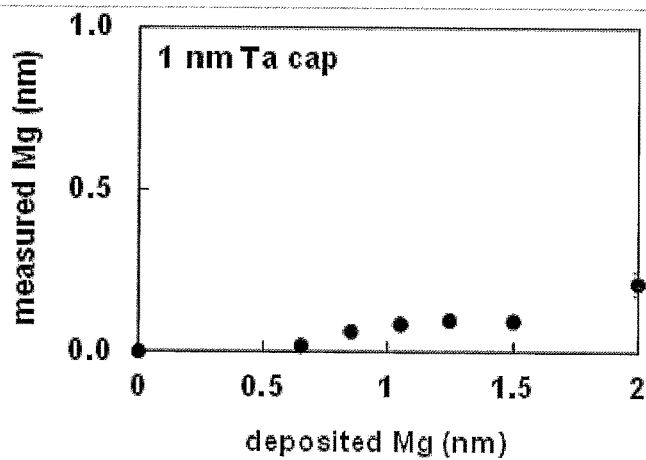

FIG. 4b further illustrates measurements for films comprising 1.5 nm thick CoFeB layers and 1 nm thick Ta functional metal layers, where the respective functional Ta layers were deposited on Mg sacrificial metal layers of varying thicknesses, x. The ERD data shown in FIG. 4b shows that no significant amount of Mg is left on the CoFeB layers, when using sacrificial metal layers having thicknesses below 0.65 nm prior to the depositing the 1 nm Ta functional metal layer.

The skilled person in the art realizes that the etching ratio may differ for different experimental conditions such as the processing equipment used. In other embodiments the etch rate may for example be larger such that a thickness of the sacrificial metal layer smaller than 2 nm may be used where the sacrificial layer may be completely removed during the deposition of the functional metal layer.

Figure 4C:
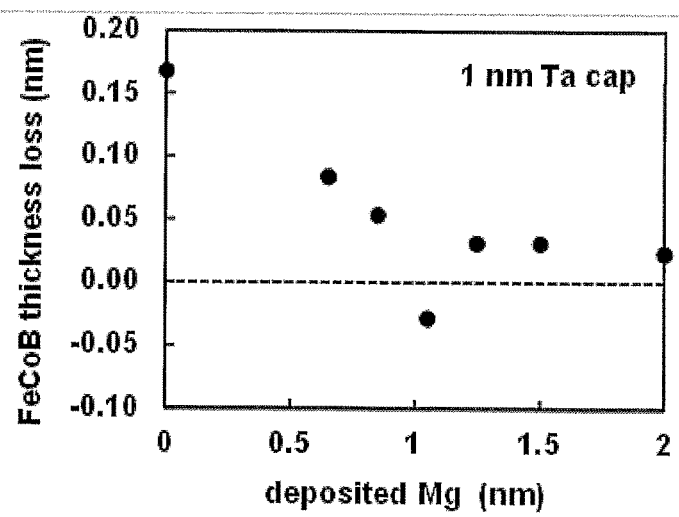

FIG. 4c illustrates experimental data for measurements obtained on CoFeB layers onto which sacrificial metal layers of Mg, having different thicknesses, where deposited. The thickness loss, i.e., the reduction in thickness, of the CoFeB layers is shown as function of the thickness of the deposited sacrificial metal layer after deposition of a functional metal layer of Ta with a thickness of 1 nm. The dotted line shows the reference value collected on a sample without Ta deposition. The thickness loss data were extracted from Rutherford back scattering (RBS) measurements. The film thickness was calculated from the ERD and RBS measurement using the bulk densities of the material involved.

FIG. 4c shows that when no Mg is present, the CoFeB layer is removed by about 0.17 nm when deposition 1 nm of Ta. It may further be concluded that for thickness up to 0.65 nm the Mg sacrificial metal layer acts as a sacrificial protective layer in the sense that the layer is completely removed. For thicker Mg sacrificial metal layers thickness a reduction of the CoFeB layer may be reduced. However, when using a thicker Mg layer portion of the Mg layer may remain on the CoFeB layer which may provide undesirable properties.

In the above description the sacrificial metal layer was disclosed as comprising Mg and the functional metal layer as comprising Ta. This is advantageous as Mg atoms are light and the risk of damaging the top surface of the layer may therefore be reduced. The Ta atoms are moreover heavier than the Mg atoms such that the Ta atoms impinging on the Mg may efficiently remove the Mg.

In other embodiments the sacrificial metal layer may comprise Al, Ca, Zn, or a combination thereof, which is advantageous in that the sacrificial metal layer may be removed by sputtering during the deposition of the functional metal layer. Moreover, by this arrangement the risk of damaging the top surface of the layer may further be minimized as Al, Ca and Zn are also light metal elements which may be deposited with a reduced risk of damaging the top surface. Further, Al, Ca and Zn efficiently protect the top surface during the deposition of the functional metal layer.

To this end, the functional metal layer may comprise Co, Ti, W, Mo, Ru, Hf, or a combination thereof which is advantageous in that the method may be used to fabricate various types of devices comprising Co, Ti, W, Mo, Ru or Hf. The functional layer may, moreover, comprise these materials and Ta.

Figure 5:
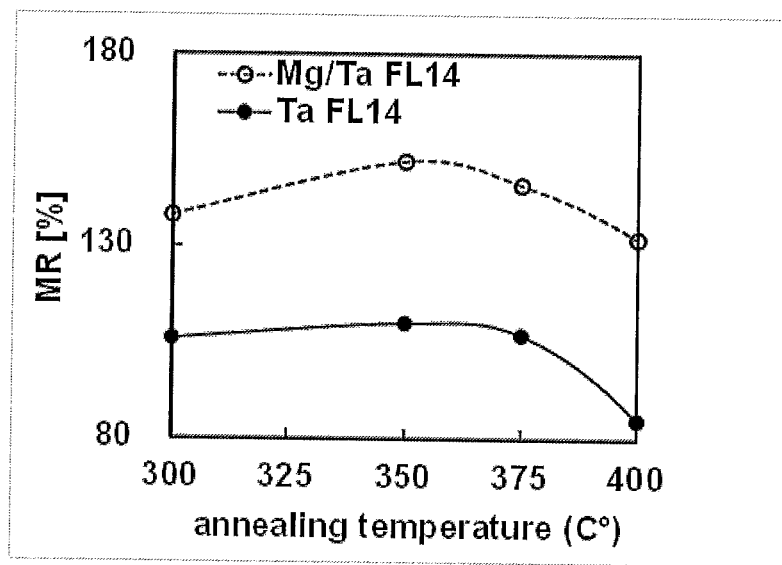
FIG. 5 illustrates measurements of magnetoresistance as function of annealing temperature obtained on CoFeB layers onto which Ta layers have been deposited, according to embodiments.

FIG. 5 illustrates experimental data for measurements obtained on CoFeB layers onto which Ta layers have been deposited. The dashed curve in FIG. 5 illustrates the measured magnetoresistance as function of annealing temperature for a layer structure where a sacrificial metal layer of Mg was used prior to the Ta deposition. The solid curve illustrates the measured magnetoresistance as function of annealing temperature for a layer structure where Ta was directly deposited on the CoFeB.

From the experimental data it may be observed that when annealing the stacks up to 400° C., the Ta capped structures fabricated by using the sacrificial layer maintain higher perpendicular anisotropy relative to the structures for which Ta was directly deposited on the CoFeB. The use of a sacrificial layer thereby improves the robustness during annealing and a better performance may be achieved.

Figure 6:
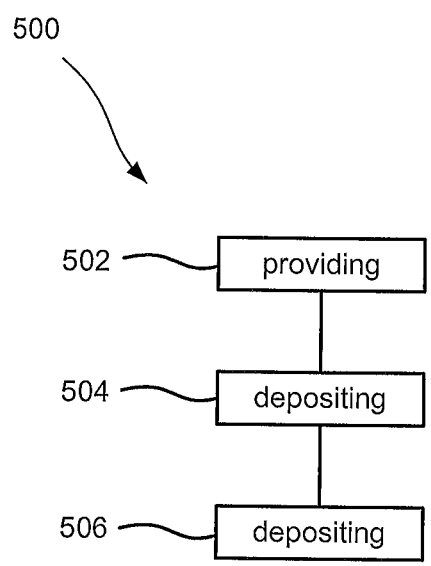
FIG. 6 illustrates a method of protecting a top surface of a layer in a semiconductor structure, according to embodiments.

In the following the method for protecting a top surface of a layer in a semiconductor structure will be discussed with reference to FIG. 6.

The method 500 comprises providing 502 a layer 104 on a substrate 102, the layer 104 having an initial thickness $t_0$ and an initial composition $C_0$, and a top surface 108.

Next a sacrificial metal layer 106 on and in contact with the top surface 108, is deposited 504 by means of physical vapor deposition, PVD. The sacrificial metal layer 106 deposited comprises a light metal element.

A functional metal layer 110 is thereafter deposited 506 on and in contact with the sacrificial metal layer 106 by means of physical vapor deposition. During the deposition 506 of the functional metal layer 110 the sacrificial metal layer 106 is removed by sputtering such that an interface 112 is formed between the top surface 108 and the functional metal layer 106. The sacrificial metal layer 106 thereby protects the top surface 108 during the deposition 506 of the functional metal layer 110 such that, the layer 104 has a final thickness $t_f$ matching or substantially matching the initial thickness $t_0$ and a final composition $C_f$ corresponding to the initial composition $C_0$.

The function and benefits of the method 500 are described above in relation to the formation of the semiconductor structures 100, 200. The above mentioned features, when applicable, apply to the method 500 as well. In order to avoid undue repetition, reference is made to the above.

It should, however, be noted that the method 500 for protecting a top surface 108 of a layer 104 in a semiconductor structure 100, 200 may be used from other semiconductor structures than the ones disclosed above in relation to STM-MRAM devices.

The layer 104 may for example comprise a high-k dielectric material or an oxide. More specifically, the method 500 may advantageously be used when the formation of an interface between a high-k dielectric or an oxide material and another material is crucial in the sense that the high-k dielectric or the oxide material need to be protected during the formation of other material such that the risk of damaging the high-k dielectric or the oxide material is reduced.

The person skilled in the art further realizes that the present disclosure by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is claimed is:

1. A method of fabricating a semiconductor structure, the method comprising:
   providing a layer on a substrate, the layer having an initial thickness and an initial composition;
   depositing by physical vapor deposition (PVD) a sacrificial metal layer on and contacting the layer, the sacrificial metal layer comprising a metal element having an atomic number of 36 or less; and
   depositing by PVD a functional metal layer on and contacting the sacrificial metal layer,
   wherein during the deposition of the functional metal layer, at least a portion of the sacrificial metal layer is removed by sputtering such that an interface is formed in which the layer and the functional metal layer contact each other, and
   wherein the sacrificial metal layer substantially protects the layer during the deposition of the functional metal layer, such that a final thickness of the layer substantially matches the initial thickness and a final composition of the layer substantially matches the initial composition.

2. The method according to claim 1, wherein the layer comprises Co, Fe, B or a combination thereof.

3. The method according to claim 2, wherein the sacrificial metal layer comprises Mg, Al, Ca, Zn or a combination thereof.

4. The method according to claim 1, wherein the functional metal layer is an amorphous metal layer.

5. The method according to claim 1, wherein the functional metal layer comprises Ta.

6. The method according to claim 1 wherein an initial thickness of the sacrificial metal layer is less than than three times a final thickness of the functional metal layer.

7. The method according to claim 6, wherein the initial thickness of the sacrificial metal layer is less than 2 nm.

8. The method according to claim 1, further comprising annealing the semiconductor structure at a temperature of 250° C.-400° C. to at least partially crystallizes the layer into a substantially [001]-orientated layer.

9. The method according to claim 1, wherein the layer is a ferromagnetic layer.

10. The method according to claim 9, wherein the layer is a ferromagnetic layer having a perpendicular magnetic anisotropy.

11. The method according to claim 9, wherein the layer and the functional metal layer form part of a spin-transfer torque magnetoresistive random-access memory (STT-MRAM) stack.

12. The method according to claim 11, further comprising forming a magnetic tunnel junction (MTJ), wherein the layer forms part of the MTJ.

13. The method according to claim 12, further comprising forming an electrode adjacent to the functional metal layer.

14. The method according to claim 1, wherein the layer is formed of a high-k dielectric material or an oxide.

15. The method according claim 1, wherein the functional metal layer comprises Co, Ti, W, Mo, Ru, Hf or a combination thereof.

* * * * *

UNITED STATES PATENT AND TRADEMARK OFFICE
CERTIFICATE OF CORRECTION

PATENT NO. : 10,333,059 B2
APPLICATION NO. : 15/079407
DATED : June 25, 2019
INVENTOR(S) : Johan Swerts It is certified that error appears in the above-identified patent and that said Letters Patent is hereby corrected as shown below:

In the Specification

In Column 6, Line 8, change "of of" to --of--.

In Column 6, Line 27, change "of of" to --of--.

In Column 6, Line 37, change "the a" to --a--.

In the Claims

In Column 12, Line 23, Claim 6, change "than than" to --than--.

In Column 12, Line 47, Claim 15, after "according" insert --to--.

Signed and Sealed this
Thirty-first Day of December, 2019

Andrei Iancu
*Director of the United States Patent and Trademark Office*